US012723176B2

(12) United States Patent
Okuno et al.

(10) Patent No.: US 12,723,176 B2
(45) Date of Patent: Sep. 1, 2026

(54) METHOD OF MANUFACTURING LAMINATE AND KIT OF ADHESIVE COMPOSITIONS

(71) Applicant: NISSAN CHEMICAL CORPORATION, Tokyo (JP)

(72) Inventors: Takahisa Okuno, Toyama (JP); Yuki Usui, Toyama (JP); Tetsuya Shinjo, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 133 days.

(21) Appl. No.: 18/292,056

(22) PCT Filed: Jul. 14, 2022

(86) PCT No.: PCT/JP2022/027646
§ 371 (c)(1),
(2) Date: Jan. 25, 2024

(87) PCT Pub. No.: WO2023/008204
PCT Pub. Date: Feb. 2, 2023

(65) Prior Publication Data

US 2024/0352281 A1 Oct. 24, 2024

(30) Foreign Application Priority Data

Jul. 26, 2021 (JP) ................................ 2021-121472

(51) Int. Cl.
*C09J 5/06* (2006.01)
*C09J 5/04* (2006.01)
(Continued)

(52) U.S. Cl.
CPC . *C09J 5/06* (2013.01); *C09J 5/04* (2013.01); *C09J 7/10* (2018.01); *C09J 183/06* (2013.01);
(Continued)

(58) Field of Classification Search
CPC ......... C09J 5/06; C09J 5/04; C09J 7/10; C09J 183/06; C09J 2203/326; C09J 2301/208;
(Continued)

(56) References Cited

U.S. PATENT DOCUMENTS 9,941,145 B2 4/2018 Tanabe et al.
10,903,106 B2 1/2021 Kamibayashi et al.
(Continued)

FOREIGN PATENT DOCUMENTS

EP 0 818 520 A2 1/1998
EP 3 477 685 A1 1/2019
(Continued)

OTHER PUBLICATIONS

Extended European Search Report that issued on Jun. 6, 2025, in EP Patent Application No. 22849268.2.
(Continued)

*Primary Examiner* — Michael N Orlando
(74) *Attorney, Agent, or Firm* — Greenblum & Bernstein, P.L.C.

(57) ABSTRACT

A method of manufacturing a laminate includes forming a first adhesive coating layer on a surface of a support substrate; forming a second adhesive coating layer on a surface of a semiconductor substrate; and bonding the first and second adhesive coating layer, followed by heating, to form an adhesive layer from the first adhesive coating layer and the second adhesive coating layer, wherein the first adhesive coating layer is formed from a first adhesive composition, the second adhesive coating layer is formed from a second adhesive composition, and one of the first adhesive composition and the second adhesive composition contains a first
(Continued)

thermosetting component and a second thermosetting component that reacts with the first thermosetting component in the presence of a catalyst, and the other contains the catalyst, and at least one of the first adhesive composition and the second adhesive composition contains a release agent component.

4 Claims, 1 Drawing Sheet

(51) Int. Cl.

| | |
|---|---|
| ***C09J 7/10*** | (2018.01) |
| ***C09J 183/06*** | (2006.01) |
| ***H10P 72/70*** | (2026.01) |

(52) U.S. Cl.
CPC ......... *H10P 72/74* (2026.01); *C09J 2203/326* (2013.01); *C09J 2301/208* (2020.08); *C09J 2301/304* (2020.08); *C09J 2301/408* (2020.08); *C09J 2301/502* (2020.08); *H10P 72/7412* (2026.01); *H10P 72/7422* (2026.01); *H10P 72/744* (2026.01)

(58) Field of Classification Search
CPC ............ C09J 2301/304; C09J 2301/408; C09J 2301/502; C09J 2483/00; C09J 183/04; C09J 5/02; C09J 2483/005; H01L 21/6835; H01L 2221/68318; H01L 2221/6834; H01L 2221/68381; H01L 2221/68327; H01L 2221/68386; H01L 21/02; H01L 21/304; C08G 77/12; C08G 77/20; B32B 7/06; B32B 7/12; B32B 27/00; B32B 37/12; B32B 2037/1253; C08L 83/00; C08K 5/56
See application file for complete search history.

(56) References Cited

U.S. PATENT DOCUMENTS

| | | | | |
|---|---|---|---|---|
| 11,183,415 | B2 | 11/2021 | Ogino et al. | |
| 11,776,837 | B2 | 10/2023 | Moriya et al. | |
| 2015/0337188 | A1* | 11/2015 | Sakakibara | B32B 37/12 525/478 |
| 2019/0164802 | A1* | 5/2019 | Ogino | C09J 5/06 |
| 2020/0353735 | A1 | 11/2020 | Ogino et al. | |
| 2021/0130666 | A1 | 5/2021 | Sawada et al. | |
| 2022/0010178 | A1 | 1/2022 | Okuno et al. | |
| 2022/0073801 | A1 | 3/2022 | Ogino et al. | |
| 2022/0352001 | A1 | 11/2022 | Muto et al. | |
| 2022/0411684 | A1 | 12/2022 | Ogata et al. | |

FOREIGN PATENT DOCUMENTS

| | | | |
|---|---|---|---|
| JP | 2017-13311 | A | 1/2017 |
| KR | 10-2020-0079491 | | 7/2020 |
| WO | 2015/190438 | A1 | 12/2015 |
| WO | 2017/221772 | A1 | 12/2017 |
| WO | 2019/212008 | A1 | 11/2019 |
| WO | 2020/105586 | A1 | 5/2020 |
| WO | 2020/111069 | A1 | 6/2020 |
| WO | 2020/138240 | A1 | 7/2020 |
| WO | 2021/065547 | A1 | 4/2021 |
| WO | 2021/131925 | A1 | 7/2021 |

OTHER PUBLICATIONS

Communication pursuant to Article 94(3) EPC that issued on Jun. 20, 2025, in EP Patent Application No. 22849268.2.
International Search Report and Written Opinion of the International Searching Authority that issued in International Pat. Appl. No. PCT/JP2022/027646, dated Sep. 27, 2022, along with an English translation thereof.
Office Action that issued on Dec. 29, 2025, in corresponding Korean Patent Application No. 10-2024-7003345, along with English translation thereof.

* cited by examiner

[FIG. 1]
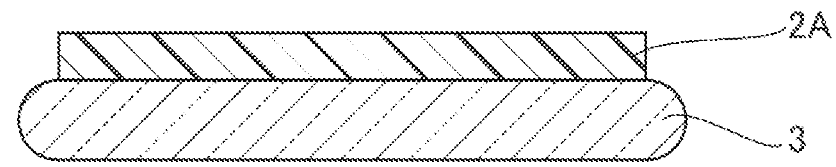
[FIG. 2]
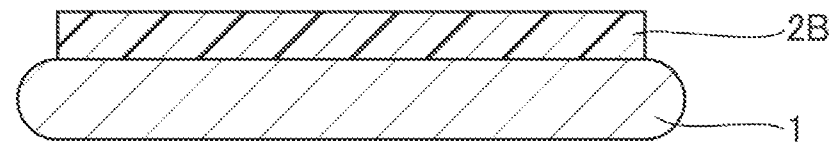
[FIG. 3]
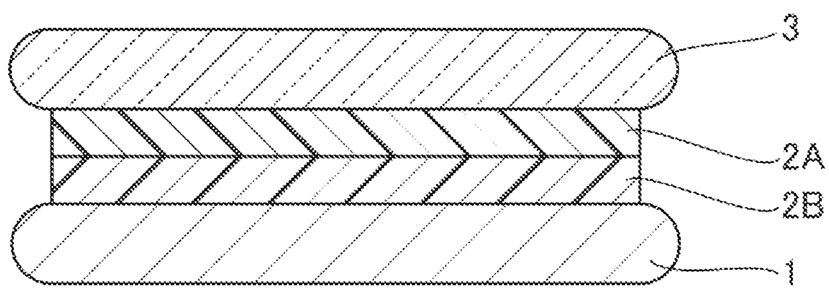
[FIG. 4]
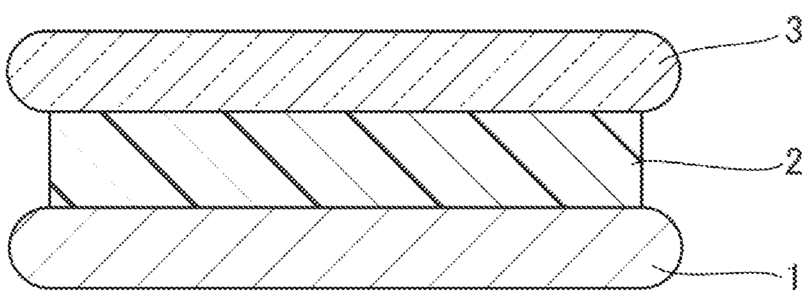

METHOD OF MANUFACTURING LAMINATE AND KIT OF ADHESIVE COMPOSITIONS

TECHNICAL FIELD

The present invention relates to a method of manufacturing a laminate, a method of manufacturing a processed semiconductor substrate, and a kit of adhesive compositions.

BACKGROUND ART

Conventionally, semiconductor wafers have been integrated in a two-dimensional planar direction. For the purpose of further integration, a semiconductor integration technology in which the plane is further integrated (laminated) in a three-dimensional direction has been required. This three-dimensional lamination is a technique of integrating multiple layers while being connected with a through silicon via (TSV). At the time of integrating multiple layers, each wafer to be integrated is thinned by polishing on the side opposite to the formed circuit surface (that is, the back surface), and the thinned semiconductor wafers are laminated.

A semiconductor wafer before thinning (also referred to herein simply as a wafer) is bonded to a support for polishing with a polishing apparatus. The adhesion at this time is referred to as temporary adhesion because it must be easily peeled off after polishing. This temporary adhesion must be easily removed from the support. When a large force is applied to the removal, the thinned semiconductor wafer may be cut or deformed. The removal is easily performed such that the situation does not occur. However, at the time of polishing the back surface of a semiconductor wafer, it is not preferable that the semiconductor wafer is detached or displaced due to polishing stress. Therefore, the performance required for temporary adhesion is to withstand the stress during polishing and to be easily removed after polishing.

For example, there is a demand for a performance having a high stress (strong adhesive force) in the planar direction at the time of polishing and having a low stress (weak adhesive force) in the longitudinal direction at the time of removal.

For such an adhesion and separation process, the following temporary adhesion material for processing a wafer has been proposed as a temporary adhesion material for processing a wafer (see Patent Literature 1).

A temporary adhesion material for processing a wafer for temporary adhering a wafer having a front surface of a circuit surface and a back surface to be processed to a support, the temporary adhesion material for processing a wafer includes a composite temporary adhesion material layer having a first temporary adhesion material layer made of a thermoplastic resin layer (A), a second temporary adhesion material layer made of a thermosetting siloxane polymer layer (B) that is laminated on the first temporary adhesion material layer, and a third temporary adhesion material layer made of a thermosetting polymer layer (C) that is laminated on the second temporary adhesion material layer, wherein the thermoplastic resin layer (A) is a resin layer of a composition containing (A-1) a thermoplastic resin: 100 parts by mass, and (A-2) a curing catalyst: more than 0 parts by mass and 1 part by mass or less as the active ingredient (in terms of mass) with respect to 100 parts by mass of the (A-1), and the thermosetting siloxane polymer layer (B) is a polymer layer that is curable through the curing catalyst in the layer (A) laminated to be adjacent to the (B) layer.

CITATION LIST

Patent Literature

Patent Literature 1: JP 2017-13311 A

SUMMARY OF INVENTION

Technical Problem

In the technique proposed in Patent Literature 1, since the composite temporary adhesion material layer has three layers: the first temporary adhesion material layer, the second temporary adhesion material layer, and the third temporary adhesion material layer, the number of materials to be handled is increased and the number of steps for forming the composite temporary adhesion material layer is also increased as compared with the case where the adhesive layer is one layer or two layers.

The present invention has been made in view of the above circumstances, and an object of the present invention is to provide a method of manufacturing a laminate by which a laminate capable of separating the support substrate and the semiconductor substrate can be manufactured while suppressing the number of precursor layers in manufacturing the adhesive layer, a method of manufacturing a processed semiconductor substrate using the method of manufacturing a laminate, and a kit of adhesive compositions usable therein.

Solution to Problem

As a result of intensive studies to solve the above problems, the present inventors have found that the above problems can be solved, and have completed the present invention having the following gist.

That is, the present invention includes the following.

[1] A method of manufacturing a laminate, the method including:

a step of forming a first adhesive coating layer on a surface of a support substrate;

a step of forming a second adhesive coating layer on a surface of a semiconductor substrate; and a step of bonding the first adhesive coating layer and the second adhesive coating layer, followed by heating, to form the adhesive layer from the first adhesive coating layer and the second adhesive coating layer, wherein the first adhesive coating layer is formed from a first adhesive composition, the second adhesive coating layer is formed from a second adhesive composition, and the first adhesive composition and the second adhesive composition satisfy the following (1) or (2):

(1): the first adhesive composition contains a first thermosetting component, and a second thermosetting component that reacts with the first thermosetting component in the presence of a catalyst, the second adhesive composition contains the catalyst, and at least one of the first adhesive composition and the second adhesive composition contains a release agent component; and (2): the second adhesive composition contains a first thermosetting component, and a second thermosetting component that reacts with the first thermosetting component in the presence of a catalyst, the first adhesive composition contains the catalyst, and at least one of the first adhesive composition and the second adhesive composition contains a release agent component.

[2] The method of manufacturing a laminate according to [1], wherein the first thermosetting component has an alkenyl group having 2 to 40 carbon atoms bonded to a silicon atom, the second thermosetting component has a Si—H group, and the catalyst includes a platinum group metal-based catalyst (A2).

[3] The method of manufacturing a laminate according to [2], wherein the first thermosetting component includes a polyorganosiloxane (a1) having an alkenyl group having 2 to 40 carbon atoms bonded to a silicon atom, and the second thermosetting component includes a polyorganosiloxane (a2) having a Si—H group.

[4] The method of manufacturing a laminate according to any one of [1] to [3], wherein the release agent component includes a non-curable polyorganosiloxane.

[5] A method of manufacturing a processed semiconductor substrate, the method including:

a first step of processing the semiconductor substrate of the laminate manufactured by the method of manufacturing a laminate according to any one of [1] to [4]; and a second step of separating the semiconductor substrate processed in the first step and the support substrate from each other.

[6] A kit of adhesive compositions including a first adhesive composition and a second adhesive composition, wherein the first adhesive composition and the second adhesive composition satisfy the following (1) or (2):

(1): the first adhesive composition contains a first thermosetting component, and a second thermosetting component that reacts with the first thermosetting component in the presence of a catalyst, the second adhesive composition contains the catalyst, and at least one of the first adhesive composition and the second adhesive composition contains a release agent component; and (2): the second adhesive composition contains a first thermosetting component, and a second thermosetting component that reacts with the first thermosetting component in the presence of a catalyst, the first adhesive composition contains the catalyst, and at least one of the first adhesive composition and the second adhesive composition contains a release agent component.

[7] The kit of adhesive compositions according to [6], being used in the method of manufacturing a laminate according to any one of [1] to [4].

Advantageous Effects of Invention

According to the present invention, it is possible to provide a method of manufacturing a laminate by which a laminate capable of separating the support substrate and the semiconductor substrate can be manufactured while suppressing the number of precursor layers in manufacturing the adhesive layer, a method of manufacturing a processed semiconductor substrate using the method of manufacturing a laminate, and a kit of adhesive compositions usable therein.

BRIEF DESCRIPTION OF DRAWINGS

FIG. 1 is a schematic cross-sectional view for illustrating an example of a method of manufacturing a laminate of the present invention (part 1).

FIG. 2 is a schematic cross-sectional view for illustrating an example of a method of manufacturing a laminate of the present invention (part 2).

FIG. 3 is a schematic cross-sectional view for illustrating an example of a method of manufacturing a laminate of the present invention (part 3).

FIG. 4 is a schematic cross-sectional view for illustrating an example of a method of manufacturing a laminate of the present invention (part 4).

DESCRIPTION OF EMBODIMENTS (Method of Manufacturing Laminate)

The method of manufacturing a laminate of the present invention is a method of manufacturing a laminate including a semiconductor substrate, a support substrate, and an adhesive layer.

In the laminate, the adhesive layer is provided between the semiconductor substrate and the support substrate.

The method of manufacturing a laminate of the present invention includes a step of forming a first adhesive coating layer, a step of forming a second adhesive coating layer, and a step of forming an adhesive layer, and if necessary, other steps.

The step of forming a first adhesive coating layer is a step of forming a first adhesive coating layer on the surface of the support substrate.

The step of forming a second adhesive coating layer is a step of forming a second adhesive coating layer on a surface of the semiconductor substrate.

The step of forming an adhesive layer is a step of bonding the first adhesive coating layer and the second adhesive coating layer, followed by heating, to form the adhesive layer from the first adhesive coating layer and the second adhesive coating layer.

The first adhesive coating layer is formed from a first adhesive composition.

The second adhesive coating layer is formed from a second adhesive composition.

The first adhesive composition and the second adhesive composition satisfy the following (1) or (2).

(1): The first adhesive composition contains a first thermosetting component, and a second thermosetting component that reacts with the first thermosetting component in the presence of a catalyst. The second adhesive composition contains the catalyst. At least one of the first adhesive composition and the second adhesive composition contains a release agent component.

(2): The second adhesive composition contains a first thermosetting component, and a second thermosetting component that reacts with the first thermosetting component in the presence of a catalyst. The first adhesive composition contains the catalyst. At least one of the first adhesive composition and the second adhesive composition contains a release agent component.

According to the method of manufacturing a laminate of the present invention, since the adhesive layer to be formed contains a release agent component, a laminate capable of separating the support substrate and the semiconductor substrate can be manufactured while suppressing the number of precursor layers in manufacturing the adhesive layer.

In the method of manufacturing a laminate of the present invention, the combination of the first thermosetting component and the second thermosetting component and the catalyst, which are for forming the adhesive layer, are divided into the first adhesive composition and the second adhesive composition. Therefore, curing does not proceed until the first adhesive coating layer and the second adhesive coating layer are bonded together. Therefore, the first adhesive composition and the second adhesive composition achieve a prolonged pot life without containing a polymerization inhibitor. Furthermore, the pot life after each of the first adhesive coating layer and the second adhesive coating layer is formed and before they are bonded can be longer than the pot life after the adhesive coating layer is formed from an adhesive composition containing the first thermosetting component, the second thermosetting component, and the catalyst and before the semiconductor substrate and the support substrate are bonded with each other.

<Step of Forming First Adhesive Coating Layer>

The step of forming a first adhesive coating layer is a step of forming a first adhesive coating layer on the surface of the support substrate.

The first adhesive coating layer is formed from a first adhesive composition.

Specific examples of the support substrate and the first adhesive composition will be described later.

<Step of Forming Second Adhesive Coating Layer>

The step of forming a second adhesive coating layer is a step of forming a second adhesive coating layer on a surface of the semiconductor substrate.

The second adhesive coating layer is formed from a second adhesive composition.

Specific examples of the semiconductor substrate and the second adhesive composition will be described later.

The order of the step of forming a first adhesive coating layer and the step of forming a second adhesive coating layer is not particularly limited.

<<First Adhesive Coating Layer and Second Adhesive Coating Layer>>

The first adhesive coating layer is formed from a first adhesive composition.

The second adhesive coating layer is formed from a second adhesive composition.

Examples of a method of forming the first adhesive coating layer from the first adhesive composition include coating. The coating method is usually spin coating.

Examples of a method of forming the first adhesive coating layer from the first adhesive composition include a method in which the first adhesive composition is applied to the surface of the release agent coating layer and heated.

In addition, as another method of forming the first adhesive coating layer from the first adhesive composition, a method of separately forming a coating film from the first adhesive composition by a spin coating method or the like and attaching the sheet-like coating film as the first adhesive coating layer to the surface of the release agent coating layer can be adopted.

Examples of a method of forming the second adhesive coating layer from the second adhesive composition include coating. The coating method is usually spin coating.

Examples of a method of forming the second adhesive coating layer from the second adhesive composition include a method in which the second adhesive composition is applied to the surface of the semiconductor substrate and heated.

In addition, as another method of forming the second adhesive coating layer from the second adhesive composition, a method of separately forming a coating film from the second adhesive composition by a spin coating method or the like and attaching the sheet-like coating film as the second adhesive coating layer to the surface of the semiconductor substrate can be adopted.

The heating temperature of the applied first or second adhesive composition varies depending on the type and amount of the adhesive component contained in the first or second adhesive composition, whether or not a solvent is contained, the boiling point of the solvent to be used, the desired thickness of the adhesive layer, and the like, and thus cannot be generally defined; however, the heating temperature is usually 80 to 150° C., and the heating time is usually 30 seconds to 5 minutes.

When the first or second adhesive composition contains a solvent, the applied first or second adhesive composition is usually heated.

The heating can be performed using, for example, a hot plate or an oven.

As described above, the first adhesive composition and the second adhesive composition satisfy the following (1) or (2).

(1): The first adhesive composition contains a first thermosetting component, and a second thermosetting component that reacts with the first thermosetting component in the presence of a catalyst. The second adhesive composition contains the catalyst. At least one of the first adhesive composition and the second adhesive composition contains a release agent component.

(2): The second adhesive composition contains a first thermosetting component, and a second thermosetting component that reacts with the first thermosetting component in the presence of a catalyst. The first adhesive composition contains the catalyst. At least one of the first adhesive composition and the second adhesive composition contains a release agent component.

Hereinafter, the first adhesive composition or the second adhesive composition containing a first thermosetting component and a second thermosetting component is referred to as a "thermosetting component-containing composition" Hereinafter, the first adhesive composition or the second adhesive composition containing a catalyst is referred to as a "catalyst-containing composition".

The film thickness of the first adhesive coating layer or the second adhesive coating layer obtained by applying the thermosetting component-containing composition and heating the composition as necessary is usually about fpm to 500 μm, and appropriately determined so as to finally fall within the range of the thickness of the adhesive layer described later.

The film thickness of the first adhesive coating layer or the second adhesive coating layer obtained by applying the catalyst-containing composition and heating the composition as necessary is usually about 100 nm to 100 μm, and appropriately determined so as to finally fall within the range of the thickness of the adhesive layer described later.

Subsequently, before describing the step of forming an adhesive layer, specific examples of the semiconductor substrate, the support substrate, the first adhesive composition, and the second adhesive composition will be described.

<Support Substrate>

The support substrate is not particularly limited as long as it is a member capable of supporting the semiconductor substrate when the semiconductor substrate is processed. Examples thereof include a glass support substrate and a silicon support substrate.

The shape of the support substrate is not particularly limited, and examples thereof include a disk shape. Note that the disk-shaped support substrate does not need to have a complete circular surface. For example, the outer periphery of the support substrate may have a straight portion called an orientation flat or may have a cut called a notch.

The thickness of the disk-shaped support substrate may be appropriately determined according to the size of the semiconductor substrate and the like, and is not particularly limited, and is, for example, 500 to 1,000 μm.

The diameter of the disk-shaped support substrate may be appropriately determined according to the size of the semiconductor substrate and the like, and is not particularly limited, and is, for example, 100 to 1,000 mm.

An example of the support substrate is a glass wafer or a silicon wafer having a diameter of 300 mm and a thickness of about 700 μm.

<Semiconductor Substrate>

The main material constituting the entire semiconductor substrate is not particularly limited as long as it is used for this type of application, and examples thereof include silicon, silicon carbide, and a compound semiconductor.

The shape of the semiconductor substrate is not particularly limited, and is, for example, a disk shape. Note that the disk-shaped semiconductor substrate does not need to have a completely circular surface. For example, the outer periphery of the semiconductor substrate may have a straight portion called an orientation flat or may have a cut called a notch.

The thickness of the disk-shaped semiconductor substrate may be appropriately determined according to the purpose of use of the semiconductor substrate and the like, and is not particularly limited, and is, for example, 500 to 1,000 μm.

The diameter of the disk-shaped semiconductor substrate may be appropriately determined according to the purpose of use of the semiconductor substrate and the like, and is not particularly limited, and is, for example, 100 to 1,000 mm.

The semiconductor substrate may have a bump. The bump is a protruding terminal.

In the laminate, when the semiconductor substrate has a bump, the semiconductor substrate has the bump on the support substrate side.

In the semiconductor substrate, the bump is usually formed on a surface on which a circuit is formed. The circuit may be a single layer or a multilayer. The shape of the circuit is not particularly limited.

In the semiconductor substrate, the surface opposite to the surface having a bump (back surface) is a surface to be processed.

The material, size, shape, structure, and density of the bump the semiconductor substrate has are not particularly limited.

Examples of the bump include a ball bump, a printed bump, a stud bump, and a plated bump.

Usually, the height, radius, and pitch of the bump are appropriately determined from the conditions of a bump height of about 1 to 200 μm, a bump radius of 1 to 200 μm, and a bump pitch of 1 to 500 μm.

Examples of the material of the bump include low-melting-point solder, high-melting-point solder, tin, indium, gold, silver, and copper. The bump may be composed only of a single component or may be composed of a plurality of components. More specific examples thereof include an alloy plating mainly containing Sn, such as SnAg bumps, SnBi bumps, Sn bumps, and AuSn bumps.

In addition, the bump may have a layered structure having a metal layer composed of at least one of these components.

An example of the semiconductor substrate is a silicon wafer having a diameter of about 300 mm and a thickness of about 770 μm.

<<First Adhesive Composition and Second Adhesive Composition (Thermosetting Component-Containing Composition and Catalyst-Containing Composition)>>

As described above, the first adhesive composition and the second adhesive composition satisfy the following (1) or (2).

(1): The first adhesive composition contains a first thermosetting component, and a second thermosetting component that reacts with the first thermosetting component in the presence of a catalyst. The second adhesive composition contains the catalyst. At least one of the first adhesive composition and the second adhesive composition contains a release agent component.

(2): The second adhesive composition contains a first thermosetting component, and a second thermosetting component that reacts with the first thermosetting component in the presence of a catalyst. The first adhesive composition contains the catalyst. At least one of the first adhesive composition and the second adhesive composition contains a release agent component.

The thermosetting component-containing composition, which is the first adhesive composition or the second adhesive composition, contains at least the first thermosetting component and the second thermosetting component, and further contains other components such as a solvent as necessary.

The catalyst-containing composition, which is the first adhesive composition or the second adhesive composition, contains at least a catalyst, and further contains other components such as a solvent as necessary.

The catalyst-containing composition may contain either the first thermosetting component or the second thermosetting component.

When the catalyst-containing composition contains the first thermosetting component, the first thermosetting component contained in the catalyst-containing composition is not particularly limited as long as it is the first thermosetting component, and may be the same thermosetting component as the first thermosetting component contained in the thermosetting component-containing composition, or may be a different thermosetting component.

When the catalyst-containing composition contains the second thermosetting component, the second thermosetting component contained in the catalyst-containing composition is not particularly limited as long as it is the second thermosetting component, and may be the same thermosetting component as the second thermosetting component contained in the thermosetting component-containing composition, or may be a different thermosetting component.

The release agent component may be contained in the thermosetting component-containing composition, may be contained in the catalyst-containing composition, or may be contained in both the thermosetting component-containing composition and the catalyst-containing composition, but it is preferable that the release agent component is contained at least in the thermosetting component-containing composition from the viewpoint of obtaining better adhesion such that peeling or the like does not occur during processing of the semiconductor substrate in the laminate and from the viewpoint of improving the mechanical releasability of the laminate after processing the semiconductor substrate.

The kit of adhesive compositions is also an object of the present invention.

The kit of adhesive compositions includes the first adhesive composition and the second adhesive composition.

The first adhesive composition is used to form the first adhesive coating layer.

The second adhesive composition is used to form the second adhesive coating layer.

<<<First Thermosetting Component, Second Thermosetting Component, Catalyst, and Release Agent Component>>>

The first thermosetting component and the second thermosetting component are not particularly limited as long as they are thermosetting components that suitably react in the presence of a catalyst.

The first thermosetting component and the second thermosetting component may be a thermosetting component that reacts in the absence of a catalyst.

The combination of the first thermosetting component, the second thermosetting component, and the catalyst is not particularly limited, but it is preferable that the first thermosetting component has an alkenyl group having 2 to 40 carbon atoms bonded to a silicon atom, the second thermosetting component has a Si—H group, and the catalyst contains a platinum group metal-based catalyst (A2).

The alkenyl group contained in the first thermosetting component and the hydrogen atom (Si—H group) contained in the second thermosetting component form a crosslinked structure to be cured by a hydrosilylation reaction with the platinum group metal-based catalyst (A2). As a result, a cured film is formed.

The first thermosetting component preferably contains a polyorganosiloxane (a1) having an alkenyl group having 2 to 40 carbon atoms bonded to a silicon atom.

The second thermosetting component preferably contains a polyorganosiloxane (a2) having a Si—H group.

Here, the alkenyl group having 2 to 40 carbon atoms may be substituted. Examples of the substituent include a halogen atom, a nitro group, a cyano group, an amino group, a hydroxy group, a carboxyl group, an aryl group, and a heteroaryl group.

An example of the polyorganosiloxane (a1) having an alkenyl group having 2 to 40 carbon atoms bonded to a silicon atom is a polyorganosiloxane (a1') that contains one or two or more of units selected from the group consisting of a siloxane unit represented by $SiO_2$ (Q' unit), a siloxane unit represented by $R^{1'} R^{2'} R^{3'} SiO_{1/2}$ (M' unit), a siloxane unit represented by $R^{4'} R^{5'} SiO_{2/2}$ (D' unit), and a siloxane unit represented by $R^{6'}SiO_{3/2}$ (T' unit), and contains at least one kind selected from the group consisting of the M' unit, the D' unit, and the T' unit.

An example of the Si—H group-containing polyorganosiloxane (a2) is a polyorganosiloxane (a2') that contains one or two or more units selected from the group consisting of a siloxane unit represented by $SiO_2$ (Q" unit), a siloxane unit represented by $R^{1''}R^{2''}R^{3''}SiO_{1/2}$ (M unit), a siloxane unit represented by $R^{4''}R^{5''}SiO_{2/2}$ (D" unit), and a siloxane unit represented by $R^{6''}SiO_{3/2}$ (T" unit), and contains at least one selected from the group consisting of the M" unit, the D" unit, and the T" unit.

$R^{1'}$ to $R^{6'}$ are groups bonded to a silicon atom and each independently represent an optionally substituted alkyl group or an optionally substituted alkenyl group, and at least one of $R^{1'}$ to $R^{6'}$ is an optionally substituted alkenyl group. Examples of the substituent include a halogen atom, a nitro group, a cyano group, an amino group, a hydroxy group, a carboxyl group, an aryl group, and a heteroaryl group.

$R^{1''}$ to $R^{6''}$ are groups or atoms bonded to a silicon atom and each independently represent an optionally substituted alkyl group or a hydrogen atom, and at least one of $R^{1''}$ to $R^{6''}$ is a hydrogen atom. Examples of the substituent include a halogen atom, a nitro group, a cyano group, an amino group, a hydroxy group, a carboxyl group, an aryl group, and a heteroaryl group.

The alkyl group may be linear, branched, or cyclic, and is preferably a linear or branched alkyl group. The number of carbon atoms thereof is not particularly limited, and is usually 1 to 40, preferably 30 or less, more preferably 20 or less, and still more preferably 10 or less.

Specific examples of the linear or branched and optionally substituted alkyl group include a methyl group, an ethyl group, a n-propyl group, an i-propyl group, a n-butyl group, an i-butyl group, a s-butyl group, a tertiary butyl group, a n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, and a 1-ethyl-2-methyl-n-propyl group, but are not limited thereto. The number of carbon atoms thereof is usually 1 to 14, preferably 1 to 10, and more preferably 1 to 6. Among them, a methyl group is particularly preferable.

Specific examples of the cyclic and optionally substituted alkyl group include: cycloalkyl groups, such as a cyclopropyl group, a cyclobutyl group, a 1-methyl-cyclopropyl group, a 2-methyl-cyclopropyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group; and bicycloalkyl groups, such as a bicyclobutyl group, a bicyclopentyl group, a bicyclohexyl group, a bicycloheptyl group, a bicyclooctyl group, a bicyclononyl group, and a bicyclodecyl group, but are not limited thereto. The number of carbon atoms thereof is usually 3 to 14, preferably 4 to 10, and more preferably 5 to 6.

The alkenyl group may be linear or branched, and the number of carbon atoms thereof is not particularly limited, and is usually 2 to 40, and is preferably 30 or less, more preferably 20 or less, and still more preferably 10 or less.

Specific examples of the linear or branched and optionally substituted alkenyl group include a vinyl group, an allyl group, a butenyl group, and a pentenyl group, and are not limited thereto. The number of carbon atoms thereof is usually 2 to 14, preferably 2 to 10, and more preferably 1 to 6. Among them, an ethenyl group and a 2-propenyl group are particularly preferable.

Specific examples of the cyclic and optionally substituted alkenyl group include, but are not limited to, cyclopentenyl and cyclohexenyl. The number of carbon atoms thereof is usually 4 to 14, preferably 5 to 10, and more preferably 5 to 6.

The polyorganosiloxane (a1') contains one or two or more units selected from the group consisting of the Q' unit, the M' unit, the D' unit, and the T' unit, and also contains at least one selected from the group consisting of the M' unit, the D' unit, and the T' unit. As the polyorganosiloxane (a1'), two or more of polyorganosiloxane satisfying such conditions may be used in combination.

Preferred combinations of two or more selected from the group consisting of the Q' unit, the M' unit, the D' unit, and the T' unit include, but are not limited to, (the Q' unit and the M' unit), (the D' unit and the M' unit), (the T' unit and the M' unit), and (the Q' unit, the T' unit, and the M' unit).

When the polyorganosiloxane (a1') contains two or more of polyorganosiloxanes, a combination of (the Q' unit and the M' unit) and (the D' unit and the M' unit), a combination of (the T' unit and the M' unit) and (the D' unit and the M' unit), and a combination of (the Q' unit, the T' unit, and the M' unit) and (the T' unit and the M' unit) are preferable, but the combination is not limited thereto.

The polyorganosiloxane (a2') contains one or two or more units selected from the group consisting of the Q" unit, the M" unit, the D" unit, and the T" unit, and also contains at least one selected from the group consisting of the M" unit, the D" unit, and the T" unit. As the polyorganosiloxane (a2'), two or more of polyorganosiloxanes satisfying such conditions may be used in combination.

Preferred combinations of two or more selected from the group consisting of the Q" unit, the M" unit, the D" unit, and the T" unit include, but are not limited to, (the M" unit and the D" unit), (the Q" unit and the M" unit), and (the Q" unit, the T" unit, and the M" unit).

The polyorganosiloxane (a1') is composed of siloxane units in which alkyl groups and/or alkenyl groups are bonded to silicon atoms thereof, and the proportion of alkenyl groups in the total substituents represented by $R^{1'}$ to $R^{6'}$ is preferably 0.1 to 50.0 mol % and more preferably 0.5 to 30.0 mol %, and the remaining $R^{1'}$ to $R^{6'}$ may be alkyl groups.

The polyorganosiloxane (a2') is composed of siloxane units in which alkyl groups and/or hydrogen atoms are bonded to silicon atoms thereof, and the proportion of hydrogen atoms in the total substituent groups and substituent atoms represented by $R^{1''}$ to $R^{6''}$ is preferably 0.1 to 50.0 mol % and more preferably 10.0 to 40.0 mol %, and the remaining $R^{1''}$ to $R^{6''}$ may be alkyl groups.

In a preferred aspect of the present invention, in the first adhesive layer coating layer and the second adhesive coating layer, the molar ratio between the alkenyl group contained in the polyorganosiloxane (a1) and the hydrogen atom constituting the Si—H bond contained in the polyorganosiloxane (a2) (alkenyl group: hydrogen atom constituting Si—H bond) is in the range of 1.0:0.5 to 1.0:0.66.

The weight average molecular weight of the polysiloxanes such as the polyorganosiloxane (a1) and the polyorganosiloxane (a2) is not particularly limited, and is usually 500 to 1,000,000, and is preferably 5,000 to 50,000 from the viewpoint of reproducibly realizing the effects of the present invention.

In the present invention, the weight average molecular weight, the number average molecular weight, and the dispersity of the polyorganosiloxanes can be measured, for example, using a GPC apparatus (EcoSEC, HLC-8320GPC; manufactured by Tosoh Corporation) and a GPC column (TSKgel SuperMultipore HZ-N and TSKgel SuperMultipore HZ-H; manufactured by Tosoh Corporation), at a column temperature of 40° C., using tetrahydrofuran as an eluent (elution solvent), at a flow amount (flow rate) of 0.35 mL/min, and using polystyrene (Shodex from Showa Denko K.K.) as a standard sample.

The viscosity of each of the polyorganosiloxane (a1) and the polyorganosiloxane (a2) is not particularly limited, but is usually 10 to 1000000 (mPa·s), and is preferably 50 to 10000 (mPa·s) from the viewpoint of reproducibly realizing the effects of the present invention. The viscosity of each of the polyorganosiloxane (a1) and the polyorganosiloxane (a2) is a value measured with an E-type rotational viscometer at 25° C.

The polyorganosiloxane (a1) and the polyorganosiloxane (a2) react with each other through hydrosilylation reaction to form a film. Therefore, the curing mechanism is different from that via, for example, silanol groups. Therefore, either siloxane does not need to contain a silanol group or a functional group that forms a silanol group through hydrolysis, such as an alkyloxy group.

In a preferred aspect of the present invention, the catalyst-containing composition contains a platinum group metal-based catalyst (A2).

Such a platinum-based metal catalyst is a catalyst for promoting hydrosilylation reaction between the alkenyl group of the polyorganosiloxane (a1) and the Si—H group of the polyorganosiloxane (a2).

Specific examples of the platinum-based metal catalyst include platinum-based catalysts such as platinum black, platinum (II) chloride, chloroplatinic acid, a reaction product of chloroplatinic acid and a monohydric alcohol, a complex of chloroplatinic acid and olefins, and platinum bisacetoacetate, but are not limited thereto.

Examples of the complex of platinum and olefins include, but are not limited to, a complex of divinyltetramethyldisiloxane and platinum.

The amount of the platinum group metal-based catalyst (A2) contained in the catalyst-containing composition is not particularly limited, but is usually in the range of 1.0 to 50.0 ppm with respect to the total amount of the polyorganosiloxane (a1) and the polyorganosiloxane (a2) in the total of the first adhesive layer coating layer and the second adhesive coating layer.

The content of the catalyst in the catalyst-containing composition is not particularly limited, but is preferably 1 to 20 mass % and more preferably 5 to 10 mass % with respect to the film constituent components.

At least one of the first adhesive composition and the second adhesive composition contains a release agent component. In other words, at least one of the thermosetting component-containing composition and the catalyst-containing composition contains a release agent component. By including the release agent component in at least one of the first adhesive composition and the second adhesive composition, the resulting adhesive layer can be suitably released with high reproducibility.

Typical examples of the release agent component include non-curable polyorganosiloxanes, and specific examples thereof include epoxy group-containing polyorganosiloxanes, methyl group-containing polyorganosiloxanes, and phenyl group-containing polyorganosiloxanes, but are not limited thereto.

Examples of the release agent component include polydimethylsiloxane. The polydimethylsiloxane may be modified. Examples of the polydimethylsiloxane which may be modified include, but are not limited to, an epoxy group-containing polydimethylsiloxane, an unmodified polydimethylsiloxane, and a phenyl group-containing polydimethylsiloxane.

Preferred examples of the polyorganosiloxane as the release agent component include epoxy group-containing polyorganosiloxanes, methyl group-containing polyorganosiloxanes, and phenyl group-containing polyorganosiloxanes, but are not limited thereto.

The weight average molecular weight of the polyorganosiloxane as the release agent component is not particularly limited, but is usually 100,000 to 2,000,000, and is preferably 200,000 to 1,200,000, and more preferably 300,000 to 900,000 from the viewpoint of reproducibly realizing the effect of the present invention. In addition, the dispersity is not particularly limited, but is usually 1.0 to 10.0, and is preferably 1.5 to 5.0, and more preferably 2.0 to 3.0 from the viewpoint of reproducibly realizing suitable peeling. The weight average molecular weight and the dispersity can be measured by the above-described method relating to the polyorganosiloxane.

The viscosity of the polyorganosiloxane as the release agent component is not particularly limited, but is usually 1,000 to 2,000,000 $mm^2/s$. The value of the viscosity of the polyorganosiloxane as the release agent component is expressed by kinematic viscosity, and centistokes (cSt) $=mm^2/s$. The value can also be determined by dividing the viscosity (mPa·s) by the density ($g/cm^3$). That is, the value can be determined from the viscosity measured with an E-type rotational viscometer measured at 25° C. and the density, and can be calculated from the equation: kinematic viscosity ($mm^2/s$)=viscosity (mPa·s)/density ($g/cm^3$).

Examples of the epoxy group-containing polyorganosiloxane include those containing a siloxane unit ($D^{10}$ unit) represented by $R^{11}R^{12}SiO_{2/2}$.

$R^{11}$ is a group bonded to a silicon atom and represents an alkyl group. $R^{12}$ is a group bonded to a silicon atom and represents an epoxy group or an organic group containing an epoxy group. Specific examples of the alkyl group can include the above-described examples.

The epoxy group in the organic group containing an epoxy group may be an independent epoxy group that is not fused with other rings, or may be an epoxy group forming a fused ring with other rings, such as a 1,2-epoxycyclohexyl group.

Specific examples of the organic group containing an epoxy group include, but are not limited to, 3-glycidoxypropyl and 2-(3,4-epoxycyclohexyl) ethyl.

In the present invention, preferred examples of the epoxy group-containing polyorganosiloxane include, but are not limited to, an epoxy group-containing polydimethylsiloxane.

The epoxy group-containing polyorganosiloxane contains the above-described siloxane unit ($D^{10}$ unit), and may contain the Q unit, the M unit, and/or the T unit in addition to the $D^{10}$ unit.

In a preferred embodiment of the present invention, specific examples of the epoxy group-containing polyorganosiloxane include a polyorganosiloxane composed only of the $D^{10}$ unit, a polyorganosiloxane containing the $D^{10}$ unit and the Q unit, a polyorganosiloxane containing the $D^{10}$ unit and the M unit, a polyorganosiloxane containing the $D^{10}$ unit and the T unit, a polyorganosiloxane containing the $D^{10}$ unit, the Q unit, and the M unit, a polyorganosiloxane containing the $D^{10}$ unit, the M unit, and the T unit, and a polyorganosiloxane containing the $D^{10}$ unit, the Q unit, the M unit, and the T unit.

The epoxy group-containing polyorganosiloxane is preferably an epoxy group-containing polydimethylsiloxane having an epoxy value of 0.1 to 5. The weight average molecular weight thereof is not particularly limited, and is usually 1,500 to 500,000, and is preferably 100,000 or less from the viewpoint of suppressing precipitation in the composition.

Specific examples of the epoxy group-containing polyorganosiloxane include, but are not limited to, those represented by the formulae (E1) to (E3).

[Chemical Formula 1]

(E1)

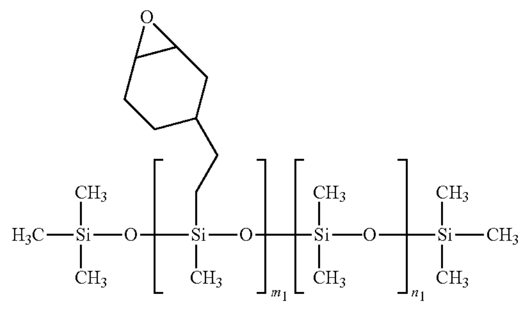

($m_1$ and $n_1$ represent the number of each repeating unit, and are positive integers.)

[Chemical Formula 2]

(E2)

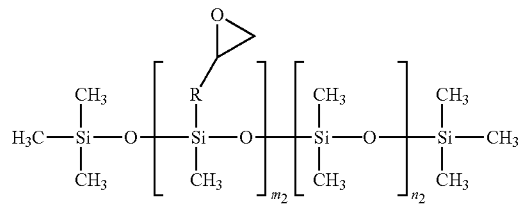

($m_2$ and $n_2$ represent the number of each repeating unit and are positive integers, and R is an alkylene group having 1 to 10 carbon atoms.)

[Chemical Formula 3]

(E3)

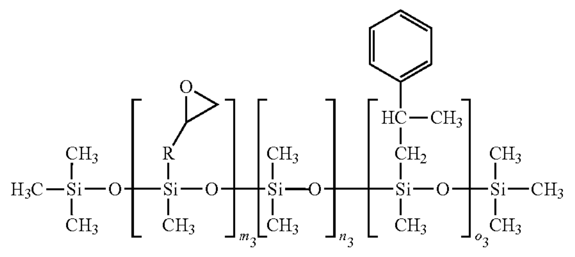

($m_3$, $n_3$, and $o_3$ represent the number of each repeating unit, and are positive integers, and R is an alkylene group having 1 to 10 carbon atoms.)

Examples of the methyl group-containing polyorganosiloxane include those containing a siloxane unit ($D^{200}$ unit) represented by $R^{210}R^{220}SiO_{2/2}$, and preferably those containing a siloxane unit ($D^{20}$ unit) represented by $R_{21}R_{21}SiO_{2/2}$.

$R^{210}$ and $R^{220}$ are groups bonded to a silicon atom, and each independently represent an alkyl group, and at least one thereof is a methyl group, and specific examples of the alkyl group can include the above-described examples.

$R^{21}$ is a group bonded to a silicon atom and represents an alkyl group, and specific examples of the alkyl group can include the above examples. Among them, $R^{21}$ is preferably a methyl group.

In the present invention, preferred examples of the methyl group-containing polyorganosiloxane include, but are not limited to, polydimethylsiloxane.

The methyl group-containing polyorganosiloxane contains the above-described siloxane units (the $D^{200}$ unit or the $D^{20}$ unit), and may contain the Q unit, the M unit, and/or the T unit in addition to the $D^{200}$ unit and the $D^{20}$ unit.

In an embodiment of the present invention, specific examples of the methyl group-containing polyorganosiloxane include a polyorganosiloxane composed only of the $D^{200}$ unit, a polyorganosiloxane containing the $D^{200}$ unit and the Q unit, a polyorganosiloxane containing the $D^{200}$ unit and the M unit, a polyorganosiloxane containing the $D^{200}$ unit and the T unit, a polyorganosiloxane containing the $D^{200}$ unit, the Q unit, and the M unit, a polyorganosiloxane containing the $D^{200}$ unit, the M unit, and the T unit, and a polyorganosiloxane containing the $D^{200}$ unit, the Q unit, the M unit, and the T unit.

In a preferred embodiment of the present invention, specific examples of the methyl group-containing polyorganosiloxane include a polyorganosiloxane composed only of the $D^{20}$ unit, a polyorganosiloxane containing the $D^{20}$ unit and the Q unit, a polyorganosiloxane containing the $D^{20}$ unit and the M unit, a polyorganosiloxane containing the $D^{20}$ unit and the T unit, a polyorganosiloxane containing the $D^{20}$ unit, the Q unit, and the M unit, a polyorganosiloxane containing the $D^{20}$ unit, the M unit, and the T unit, and a polyorganosiloxane containing the $D^{20}$ unit, the Q unit, the M unit, and the T unit.

Specific examples of the methyl group-containing polyorganosiloxane include, but are not limited to, those represented by the formula (M1).

[Chemical Formula 1]

(M1)

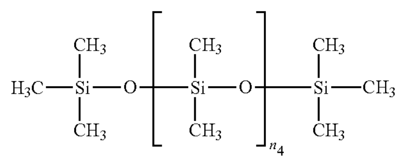

($n_4$ represents the number of repeating units, and is a positive integer.)

Examples of the phenyl group-containing polyorganosiloxane include those containing a siloxane unit ($D^{30}$ unit) represented by $R^{31}R^{32}SiO_{2/2}$.

$R^{31}$ is a group bonded to a silicon atom and represents a phenyl group or an alkyl group. $R^{32}$ is a group bonded to a silicon atom and represents a phenyl group. Specific examples of the alkyl group include the above-described examples, and a methyl group is preferable.

The phenyl group-containing polyorganosiloxane contains the above-described siloxane unit ($D^{30}$ unit), and may contain the Q unit, the M unit, and/or the T unit in addition to the $D^{30}$ unit.

In a preferred embodiment of the present invention, specific examples of the phenyl group-containing polyorganosiloxane include a polyorganosiloxane composed only of the $D^{30}$ unit, a polyorganosiloxane containing the $D^{30}$ unit and the Q unit, a polyorganosiloxane containing the $D^{30}$ unit and the M unit, a polyorganosiloxane containing the $D^{30}$ unit and the T unit, a polyorganosiloxane containing the $D^{30}$ unit, the Q unit, and the M unit, a polyorganosiloxane containing the $D^{30}$ unit, the M unit, and the T unit, and a polyorganosiloxane containing the $D^{30}$ unit, the Q unit, the M unit, and the T unit.

Specific examples of the phenyl group-containing polyorganosiloxane include, but are not limited to, those represented by the formula (P1) or (P2).

[Chemical Formula 5]

(P1)

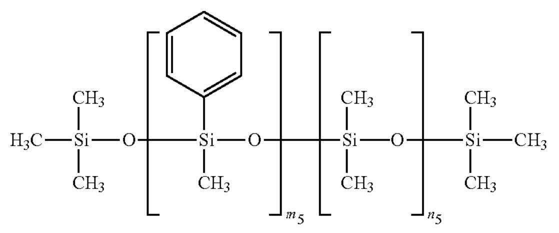

($m_5$ and $n_5$ represent the number of each repeating unit, and are positive integers.)

[Chemical Formula 6]

(P2)

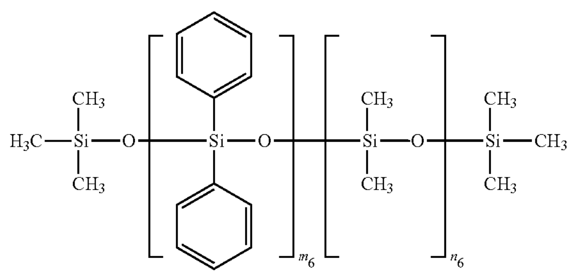

($m_6$ and $n_6$ represent the number of each repeating unit, and are positive integers.)

The polyorganosiloxane as the release agent component may be a commercially available product or a synthetic product.

Examples of commercially available products of the polyorganosiloxane include WACKERSILICONE FLUID AK series (AK 50, AK 350, AK 1000, AK 10000, AK 1000000) and GENIOPLAST GUM, which are products manufactured by Wacker Chemie AG, dimethyl silicone oils (KF-96L, KF-96A, KF-96, KF-96H, KF-69, KF-965, KF-968) and a cyclic dimethyl silicone oil (KF-995), which are manufactured by Shin-Etsu Chemical Co., Ltd.; epoxy group-containing polyorganosiloxanes (trade name: CMS-227, ECMS-327), which are manufactured by Gelest, Inc., epoxy group-containing polyorganosiloxanes manufactured by Shin-Etsu Chemical Co., Ltd. (KF-101, KF-1001, KF-1005, X-22-343), an epoxy group-containing polyorganosiloxane manufactured by Dow Corning Corp. (BY16-839); phenyl group-containing polyorganosiloxanes manufactured by Gelest, Inc. (PMM-1043, PMM-1025, PDM-0421, PDM-0821), a phenyl group-containing polyorganosiloxane manufactured by Shin-Etsu Chemical Co., Ltd. (KF50-3000CS), phenyl group-containing polyorganosiloxanes manufactured by MOMENTIVE (TSF431, TSF433), and the like, but are not limited thereto.

An example of the combination of the thermosetting component-containing composition and the catalyst-containing composition can contain the sum of the first curing component and the second thermosetting component (Here, the sum is referred to as "thermosetting component (A)".) and the release agent component (B) in any ratio, but in consideration of the balance between adhesiveness and releasability, the ratio of the thermosetting component (A) and the release agent component (B) is preferably, in a mass ratio of [(A):(B)], 99.995:0.005 to 30:70 and more preferably 99.9:0.1 to 75:25 in the first adhesive coating layer and the second adhesive coating layer.

For example, the ratio of the sum of the polyorganosiloxane (a1) having an alkenyl group having 2 to 40 carbon atoms bonded to a silicon atom and the polyorganosiloxane (a2) having a Si—H group to the non-curable polyorganosiloxane (b1) is preferably, in a mass ratio of [(a1+a2):(b1)], 99.995:0.005 to 30:70, and more preferably 99.9:0.1 to 75:25.

<<<Solvent>>>

The thermosetting component-containing composition and the catalyst-containing composition may contain a solvent for the purpose of adjusting the viscosity, and specific examples thereof include aliphatic hydrocarbons, aromatic hydrocarbons, and ketones, but are not limited thereto.

More specific examples of the solvent include hexane, heptane, octane, nonane, decane, undecane, dodecane, isododecane, menthane, limonene, toluene, xylene, mesitylene, cumene, MIBK (methyl isobutyl ketone), butyl acetate, diisobutyl ketone, 2-octanone, 2-nonanone, and 5-nonanone, but are not limited thereto. Such solvents can be used singly or in combination of two or more kinds thereof.

When the thermosetting component-containing composition and the catalyst-containing composition contain a solvent, the content thereof is appropriately determined in consideration of the desired viscosity of the composition, the coating method to be employed, the thickness of the film to be produced, and the like, but is in the range of about 10 to 90 mass % with respect to the entire composition.

<<<Other Components>>>

The catalyst-containing composition may contain a polymer other than a polyorganosiloxane as another component. Examples of such a polymer include thermoplastic resins.

Examples of the thermoplastic resin include a styrene elastomer, an ethylene-acrylate copolymer, and ethylene-acrylic acid ester-glycidyl methacrylate.

Examples of the styrene elastomer include a styrene-ethylene-butylene-styrene block copolymer (SEBS), a styrene-ethylene-propylene-styrene block copolymer (SEPS), a styrene-ethylene-ethylene-propylene-styrene block copolymer (SEEPS), a styrene-butadiene rubber (SBR), an acrylonitrile-butadiene rubber (NBR), a pyridine-butadiene rubber, a styrene-isoprene rubber (SIR), a styrene-ethylene copolymer, a polystyrene-polybutadiene-polystyrene (SBS), a polystyrene-polyisoprene-polystyrene (SIS), a poly(α-methylstyrene)-polybutadiene-poly(α-methylstyrene)(α-MeSB α-MeS), a poly(α-methylstyrene)-polyisoprene-poly(α-methylstyrene), an ethylene-propylene copolymer (EP), a styrene-chloroprene rubber (SCR), a styrene-butadiene-styrene (SBS) copolymer, a styrene-isoprene-styrene (SIS) copolymer, a styrene-polyisoprene elastomer, a styrene-polybutadiene elastomer, and a styrene-polyisoprene-butadiene random copolymer.

Examples of the ethylene-acrylate copolymer include an ethylene-methyl acrylate copolymer, an ethylene-ethyl acrylate copolymer, and an ethylene-butyl acrylate copolymer.

These may be partially or totally hydrogenated.

The content of the resin component (for example, the first thermosetting component, the thermoplastic resin) in the catalyst-containing composition is not particularly limited, but is preferably 80 to 99 mass % and more preferably 90 to 95 mass % with respect to the film constituent components.

The viscosity of each of the thermosetting component-containing composition and the catalyst-containing composition is not particularly limited, but is usually 500 to 20,000 mPa·s, and preferably 1,000 to 5,000 mPa·s at 25° C. The viscosity of each of the thermosetting component-containing composition and the catalyst-containing composition can be adjusted by changing the type of solvent to be used, the ratio thereof, the concentration of the film constituent components, and the like, in consideration of various factors such as the coating method to be used and the desired film thickness.

In the present invention, for the purpose of removing foreign substances, a solvent, a solution, or the like to be used may be filtered using a filter or the like during the production of the thermosetting component-containing composition and the catalyst-containing composition or after mixing all the components.

<Step of Forming Adhesive Layer>

The step of forming an adhesive layer is a step of bonding the first adhesive coating layer and the second adhesive coating layer, followed by heating, to form the adhesive layer from the first adhesive coating layer and the second adhesive coating layer.

In the present invention, the laminate can be obtained by combining the first adhesive coating layer and the second adhesive coating layer so as to be in contact with each other, bringing the two layers into close contact with each other through applying a load in the thickness direction of the semiconductor substrate and the support substrate while performing a heat treatment, a pressure reduction treatment, or both, as necessary, and then performing a post-heat treatment. Which treatment condition of heat treatment, pressure reduction treatment, and combination use of both is adopted is appropriately determined in consideration of various circumstances such as the types of the first adhesive composition and the second adhesive composition, the compatibility of the films obtained from both of the compositions, the film thickness, and the required adhesive strength.

The heat treatment is appropriately determined from the range of usually 20 to 150° C. from the viewpoint that when a solvent is contained in the composition, the solvent is removed, the viewpoint that the first adhesive coating layer and the second adhesive coating layer are softened to realize suitable bonding thereof, and the like. In particular, from the viewpoint of suppressing or avoiding excessive curing and unnecessary alteration of the thermosetting components, the heating temperature is preferably 130° C. or lower, more preferably 90° C. or lower, and the heating time is appropriately determined according to the heating temperature and the type of the adhesive, but from the viewpoint of reliably exhibiting suitable adhesion, the heating time is usually 30 seconds or more, and preferably 1 minute or more, but from the viewpoint of suppressing alteration of the adhesive layer and other members, the heating time is usually 10 minutes or less, and preferably 5 minutes or less.

In the pressure reduction treatment, the first adhesive coating layer and the second adhesive coating layer in contact with each other may be exposed under an atmospheric pressure of 10 to 10,000 Pa. The time for the pressure reduction treatment is usually 1 to 30 minutes.

From the viewpoint of reproducibly obtaining a laminate in which the substrates can be satisfactorily separated, the two layers in contact with each other are bonded to each other preferably by pressure reduction treatment, and more preferably by combined use of heat treatment and pressure reduction treatment.

The load in the thickness direction of the semiconductor substrate and the support substrate is not particularly limited as long as the load does not adversely affect the semiconductor substrate, the support substrate, and the two layers therebetween and can firmly adhere them, and is usually within the range of 10 to 1,000 N.

The temperature for post-heating is preferably 120° C. or higher from the viewpoint of achieving a sufficient curing rate, and is preferably 260° C. or lower from the viewpoint of preventing deterioration of the substrates and each layer.

The post-heating time is usually 1 minute or more, and preferably 5 minutes or more from the viewpoint of realizing suitable bonding of the substrates and the layers constituting the laminate, and is usually 180 minutes or less, and preferably 120 minutes or less from the viewpoint of suppressing or avoiding an adverse effect on each layer due to excessive heating.

The heating can be performed using, for example, a hot plate or an oven. When post-heating is performed using a hot plate, heating may be performed with either the semiconductor substrate or the support substrate of the laminate facing downward, but it is preferable to perform post-heating with the semiconductor substrate facing downward from the viewpoint of reproducibly realizing suitable peeling.

It is to be noted that one object of the post-heat treatment is to realize the adhesive layer, which is a more suitable self-supporting film, and to suitably realize thermosetting by the first thermosetting component and the second thermosetting component (particularly, curing by a hydrosilylation reaction).

The thickness of the adhesive layer included in the laminate produced in the present invention is not particularly limited, and is usually 5 to 500 μm, and is preferably 10 μm or more, more preferably 20 μm or more, still more preferably 30 μm or more from the viewpoint of maintaining the film strength, and is preferably 200 μm or less, more preferably 150 μm or less, still more preferably 120 μm or less, and still more preferably 70 μm or less from the viewpoint of avoiding nonuniformity caused by being a thick film.

An example of the method of manufacturing a laminate of the present invention will be described with reference to FIGS. 1 to 4.

First, the first adhesive coating layer 2A is formed on the surface of the support substrate 3 (FIG. 1). The first adhesive coating layer 2A is formed from a first adhesive composition. The adhesive coating layer 2A is formed, for example, by applying the first adhesive composition to the surface of the support substrate 3.

Next, a second adhesive coating layer 2B is formed on the surface of a semiconductor substrate 1 (FIG. 2). The second adhesive coating layer 2B is formed from a second adhesive composition. The second adhesive coating layer 2B is formed, for example, by applying the second adhesive composition to the surface of the semiconductor substrate 1.

Next, the first adhesive coating layer 2A and the second adhesive coating layer 2B are bonded and heated (FIG. 3). Then, the first adhesive coating layer 2A and the second adhesive coating layer 2B are integrated to form an adhesive layer 2. As a result, a laminate including the semiconductor substrate 1, the adhesive layer 2, and the support substrate 3 is obtained (FIG. 4).

(Method of Manufacturing Processed Semiconductor Substrate)

The method of manufacturing a processed semiconductor substrate of the present invention includes at least a first step and a second step, and further includes other steps such as a third step as necessary.

The first step is a step of processing the semiconductor substrate of the laminate manufactured by the method of manufacturing a laminate of the present invention.

The second step is a step of separating the semiconductor substrate processed in the first step and the support substrate from each other.

The third step is a step of washing the separated semiconductor substrate with a cleaning agent composition.

The processing performed on the semiconductor substrate in the first step is, for example, processing on the opposite side of the circuit surface of the wafer, and includes thinning of the wafer by polishing the back surface of the wafer. Thereafter, a through silicon via (TSV) or the like is formed, and thereafter, the thinned wafer is peeled off from the support substrate to form a laminate of the wafer, and the wafer is three-dimensionally mounted. Before and after that, a wafer back electrode and the like are also formed. In thinning the wafer and in the TSV process, the wafer is applied with heat of about 250 to 350° C. in the state of being bonded to the support substrate. The laminate produced in the present invention, as well as the adhesive layer, usually has heat resistance to the load.

Note that the processing is not limited to the above-described processing, and includes, for example, implementation of a process of mounting a semiconductor component in a case where a base material for mounting a semiconductor component is temporarily bonded to the support substrate to support the base material.

The second step is not particularly limited as long as it is a step of separating the semiconductor substrate processed in the first step and the support substrate from each other.

For example, the step includes a method of mechanical peeling with a tool having a sharp portion (so-called debonder). Specifically, for example, after the sharp portion is inserted between the semiconductor substrate and the support substrate, the semiconductor substrate and the support substrate are separated.

In the third step, cleaning is performed by spraying a cleaning agent composition to the surface of the separated semiconductor substrate, or by immersing the separated semiconductor substrate in a cleaning agent composition, and then rinsing and drying are usually performed by using a solvent. Examples of the cleaning agent composition include the following.

The cleaning agent composition usually contains a salt and a solvent.

A suitable example of the cleaning agent composition includes a cleaning agent composition containing a quaternary ammonium salt and a solvent.

The quaternary ammonium salt is composed of a quaternary ammonium cation and an anion, and is not particularly limited as long as it is used for this type of application.

Such quaternary ammonium cations typically include tetra(hydrocarbon)ammonium cations. On the other hand, the anion paired therewith includes a hydroxide ion ($OH^-$); halogen ions such as a fluorine ion ($F^-$), a chlorine ion ($Cl^-$), a bromine ion ($Br^-$), and an iodine ion ($I^-$); tetrafluoroborate ion ($BF_4^-$); hexafluorophosphate ion ($PF_6^-$); and the like, but is not limited thereto.

The quaternary ammonium salt is preferably a halogen-containing quaternary ammonium salt, and more preferably a fluorine-containing quaternary ammonium salt.

In the quaternary ammonium salt, the halogen atom may be contained in the cation or in the anion, and is preferably contained in the anion.

In a preferred embodiment, the fluorine-containing quaternary ammonium salt is a fluorinated tetra(hydrocarbon) ammonium.

Specific examples of the hydrocarbon group in the fluorinated tetra(hydrocarbon)ammonium include an alkyl group having 1 to 20 carbon atoms, an alkenyl group having 2 to 20 carbon atoms, an alkynyl group having 2 to 20 carbon atoms, and an aryl group having 6 to 20 carbon atoms.

In a more preferred embodiment, the fluorinated tetra (hydrocarbon)ammonium includes a fluorinated tetraalkylammonium.

Specific examples of the fluorinated tetraalkylammonium include, but are not limited to, fluorinated tetramethylammonium, fluorinated tetraethylammonium, fluorinated tetrapropylammonium, and fluorinated tetrabutylammonium (also referred to as tetrabutylammonium fluoride). Among them, fluorinated tetrabutylammonium is preferable.

As the quaternary ammonium salt such as a fluorinated tetra(hydrocarbon)ammonium, a hydrate may be used. The quaternary ammonium salt such as a fluorinated tetra(hydrocarbon)ammonium may be used singly or in combination of two or more kinds thereof.

The amount of the quaternary ammonium salt is not particularly limited as long as it dissolves in the solvent contained in the cleaning agent composition, and is usually 0.1 to 30 mass % with respect to the cleaning agent composition.

The solvent contained in the cleaning agent composition is not particularly limited as long as it is used for this type of use and dissolves salts such as the quaternary ammonium salt. From the viewpoint of reproducibly obtaining a cleaning agent composition having excellent detergency, from the viewpoint of obtaining a cleaning agent composition having excellent uniformity by favorably dissolving salts such as the quaternary ammonium salt, and the like, the cleaning agent composition preferably contains one or two or more amide-based solvents.

Suitable examples of the amide-based solvent include an acid amide derivative represented by the formula (Z).

[Chemical Formula 7]

(Z)

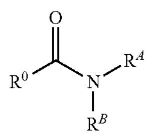

In the formula, $R^0$ represents an ethyl group, a propyl group, or an isopropyl group, and is preferably an ethyl group or an isopropyl group, more preferably an ethyl group. RA and RB each independently represent an alkyl group having 1 to 4 carbon atoms. The alkyl group having 1 to 4 carbon atoms may be linear, branched, or cyclic, and specific examples thereof include a methyl group, an ethyl group, a propyl group, an isopropyl group, a cyclopropyl group, a n-butyl group, an isobutyl group, a s-butyl group, a t-butyl group, and a cyclobutyl group. Among them, RA and RB are preferably a methyl group or an ethyl group, more preferably both a methyl group or an ethyl group, and still more preferably both a methyl group.

Examples of the acid amide derivative represented by the formula (Z) include N,N-dimethylpropionamide, N,N-diethylpropionamide, N-ethyl-N-methylpropionamide, N,N-dimethylbutyramide, N,N-diethylbutyramide, N-ethyl-N-methylbutyramide, N,N-dimethylisobutyramide, N,N-diethylisobutyramide, and N-ethyl-N-methylisobutyramide.

Among them, N,N-dimethylpropionamide and N,N-dimethylisobutyramide are particularly preferable, and N,N-dimethylpropionamide is more preferable.

The acid amide derivative represented by the formula (Z) may be synthesized by a substitution reaction between the corresponding carboxylic acid ester and amine, or a commercially available product may be used.

Another example of the preferred amide-based solvent is a lactam compound represented by the formula (Y).

[Chemical Formula 8]

(Y)

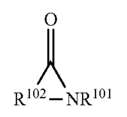

In the formula (Y), $R^{101}$ represents a hydrogen atom or an alkyl group having 1 to 6 carbon atoms, and $R^{102}$ represents an alkylene group having 1 to 6 carbon atoms. Specific examples of the alkyl group having 1 to 6 carbon atoms include a methyl group, an ethyl group, a n-propyl group, and a n-butyl group, and specific examples of the alkylene group having 1 to 6 carbon atoms include a methylene group, an ethylene group, a trimethylene group, a tetramethylene group, a pentamethylene group, and a hexamethylene group, but are not limited thereto.

Specific examples of the lactam compound represented by the formula (Y) include an α-lactam compound, a β-lactam compound, a γ-lactam compound, and a δ-lactam compound, and these compounds can be used alone or in combination of two or more thereof.

In a preferred embodiment, the lactam compound represented by the formula (Y) includes a 1-alkyl-2-pyrrolidone (N-alkyl-γ-butyrolactam), in a more preferred embodiment, N-methylpyrrolidone (NMP) or N-ethylpyrrolidone (NEP), and in a still more preferred embodiment, N-methylpyrrolidone (NMP).

The cleaning agent composition may contain one or two or more other organic solvents different from the above-mentioned amide compound.

Such other organic solvents are not particularly limited as long as they are used for this type of application and are miscible with the above-described amide compound.

Preferred other solvents include an alkyleneglycol dialkylethers, aromatic hydrocarbon compounds, cyclic structure-containing ether compounds, and the like, but are not limited thereto.

The amount of the other organic solvents different from the amide compound described above is usually appropriately determined within 95 mass % or less in the solvent contained in the cleaning agent composition as long as the quaternary ammonium salt contained in the cleaning agent composition is not precipitated or separated, and is uniformly mixed with the amide compound described above.

Incidentally, the cleaning agent composition may contain water as a solvent, but usually, only an organic solvent is intentionally used as a solvent from the viewpoint of avoiding corrosion of the substrate and the like. In this case, it is not denied that hydration water of the salt or water contained in a trace amount in the organic solvent is contained in the cleaning agent composition. The cleaning agent composition usually contains water in an amount of 5 mass % or less.

In the method of manufacturing a processed semiconductor substrate of the present invention, the processed semiconductor substrate manufactured through the third step has been favorably cleaned with the cleaning agent composition. However, it is not excluded to further clean the surface of the processed semiconductor substrate using a removal tape or the like, and the surface may be further cleaned using a removal tape or the like as necessary.

The constituent elements and method elements related to the above-described steps of the method of manufacturing a processed semiconductor substrate of the present invention may be variously changed without departing from the gist of the present invention.

The method of manufacturing a processed semiconductor substrate of the present invention may include steps other than the above-described steps.

EXAMPLES

Hereinafter, the present invention will be described more specifically with reference to Examples, but the present invention is not limited to the following Examples. The apparatuses used are as follows.

[Apparatus]

(1) Stirrer: ARE-500, a rotation and revolution mixer manufactured by THINKY CORPORATION (2) Vacuum bonding apparatus: XBS300; manufactured by SÜSS MicroTec SE.

(3) High-rigidity grinding machine: HRG300; manufactured by TOKYO SEIMITSU CO., LTD.

(4) Optical film thickness meter (film thickness measurement): F-50; manufactured by Filmetrics, INC.

(5) Substrate peeling apparatus: XBC300; manufactured by SÜSS MicroTec SE.

[1] Preparation of Adhesive Composition

Preparation Example 1

Into a 600 mL stirrer-dedicated container, 34.6 g of an MQ resin (manufactured by Wacker Chemie AG) containing a polysiloxane skeleton and a vinyl group, 5.34 g of SiH group-containing linear polydimethylsiloxane (manufactured by Wacker Chemie AG) having a viscosity of 100 mPa·s, 21.8 g of vinyl group-containing linear polydimethylsiloxane (manufactured by Wacker Chemie AG) having a viscosity of 200 mPa·s, 5.6 g of polyorganosiloxane that is a polydimethylsiloxane having a viscosity of 5,000,000 mPa·s (product name: GENIOPLAST GUM; manufactured by Wacker Chemie AG), and 18.75 g of p-menthane (manufactured by Nippon Terpene Chemicals, Inc.) were put, and stirred with a stirrer for 5 minutes to obtain a mixture.

The resulting mixture was filtered through a nylon filter 300 mesh to obtain an adhesive composition-1.

Preparation Example 2

Into a 600 mL stirrer-dedicated container, 12.5 g of an MQ resin (manufactured by Wacker Chemie AG) containing a polysiloxane skeleton and a vinyl group, 2.5 g of a platinum catalyst (manufactured by Wacker Chemie AG), 25 g of a vinyl group-containing linear polydimethylsiloxane (manufactured by Wacker Chemie AG) having a viscosity of 1,000 mPa·s, and 25 g of n-nonane (manufactured by Tokyo Chemical Industry Co., Ltd.) were put, and stirred with a stirrer for 5 minutes to obtain a mixture.

The resulting mixture was filtered through a nylon filter 300 mesh to obtain an adhesive composition-2.

[2] Production of Laminate

Example 1

The adhesive composition-1 obtained in Preparation Example 1 was spin-coated on a 300 mm silicon wafer (thickness: 775 μm) as a substrate on the device side, and then heated on a hot plate at 120° C. for 90 seconds to form an adhesive coating layer-1 on the silicon wafer as a semiconductor substrate so that the film thickness in the finally obtained laminate was 30 μm.

On the other hand, the adhesive composition-2 obtained in Preparation Example 2 was spin-coated on a 300 mm silicon wafer (thickness: 775 μm) as a substrate on the carrier side, and then heated on a hot plate at 120° C. for 90 seconds to form an adhesive coating layer-2 on the silicon wafer as a support substrate so that the film thickness in the finally obtained laminate was 5 μm.

Then, using the bonding apparatus, the two silicon wafers were bonded so as to sandwich the adhesive coating layer-1 and the adhesive coating layer-2, and then subjected to post-heating treatment at 200° C. for 10 minutes to prepare a laminate. Bonding was performed at a temperature of 23° C. and a vacuum degree of 1,500 Pa. Note that as many laminates as necessary were produced.

The device side silicon wafer of the obtained laminate was thinned to 50 μm with the high-rigidity grinding machine, and then the laminate was stuck and fixed to a dicing tape (DU-300; manufactured by NITTO DENKO CORPORATION) with the thinned device side silicon wafer side facing down.

Using the substrate peeling apparatus, a wedge was inserted between the device side substrate and the carrier side substrate, and the carrier side substrate was lifted to perform peeling. Thereafter, the results of checking whether or not the substrate can be peeled off and whether or not a crack or a residue of the adhesive composition is observed on the thinned device substrate are shown in Table 1.

Comparative Example 1

The examination was performed in the same procedure as in Example 1 except that the bonding was performed without forming the adhesive coating layer-2 on the carrier side. The evaluation results are shown in Table 1.

TABLE 1

| | Example 1 | Comparative Example 1 |
|---|---|---|
| Adhesive composition on device side substrate | 1 | 1 |
| Adhesive composition on carrier side substrate | 2 | Not provided |
| Peeled or not | Peeled | Not peeled |
| Residue on thinned device substrate after peeling | No residue | — |
| Cracking on thinned device substrate after peeling | No cracking | — |

From the results in Table 1, in the case of Example 1, good peelability was confirmed, and no residue or cracking of the thinned device substrate was observed. Regarding Comparative Example 1, since the platinum catalyst was not contained in the adhesive composition-1, curing itself did not proceed, and peeling could not be performed due to adhesiveness.

REFERENCE SIGNS LIST

1 Semiconductor substrate
2 Adhesive layer
2A First adhesive coating layer
2B Second adhesive coating layer
3 Support substrate

The invention claimed is:

1. A method of manufacturing a laminate, the method comprising:

forming a first adhesive coating layer on a surface of a support substrate;

forming a second adhesive coating layer on a surface of a semiconductor substrate; and bonding the first adhesive coating layer and the second adhesive coating layer, followed by heating, to form an adhesive layer from the first adhesive coating layer and the second adhesive coating layer, wherein the first adhesive coating layer is formed from a first adhesive composition, the second adhesive coating layer is formed from a second adhesive composition, the first adhesive composition and the second adhesive composition satisfy the following (1) or (2):

(1): the first adhesive composition contains a first thermosetting component, and a second thermosetting component that reacts with the first thermosetting component in the presence of a catalyst, the second adhesive composition contains the catalyst, and at least one of the first adhesive composition and the second adhesive composition contains a release agent component, the release agent component being a non-curable polyorganosiloxane having a kinematic viscosity of 1,000 to 2,000,000 $mm^2/s$; and (2): the second adhesive composition contains a first thermosetting component, and a second thermosetting component that reacts with the first thermosetting component in the presence of a catalyst, the first adhesive composition contains the catalyst, and at least one of the first adhesive composition and the second adhesive composition contains a release agent component, the release agent component being a non-curable polyorganosiloxane having a kinematic viscosity of 1,000 to 2,000,000 $mm^2/s$.

2. The method of manufacturing a laminate according to claim 1, wherein the first thermosetting component has an alkenyl group having 2 to 40 carbon atoms bonded to a silicon atom, the second thermosetting component has a Si—H group, and the catalyst includes a platinum group metal-based catalyst (A2).

3. The method of manufacturing a laminate according to claim 2, wherein the first thermosetting component includes a polyorganosiloxane (a1) having an alkenyl group having 2 to 40 carbon atoms bonded to a silicon atom, and the second thermosetting component includes a polyorganosiloxane (a2) having a Si—H group.

4. A method of manufacturing a processed semiconductor substrate, the method comprising:

processing the semiconductor substrate of the laminate manufactured by the method of manufacturing a laminate according to claim 1; and separating the processed semiconductor substrate and the support substrate from each other.

* * * * *